US005243250A

United States Patent [19]

Mitsutsuka

[11] Patent Number: 5,243,250

[45] Date of Patent: Sep. 7, 1993

[54] SURFACE ACOUSTIC WAVE CONVOLVER DEVICE

[75] Inventor: Syuichi Mitsutsuka, Tokyo, Japan

[73] Assignee: Clarion Co., Ltd., Tokyo, Japan

[21] Appl. No.: 839,105

[22] Filed: Feb. 20, 1992

[30] Foreign Application Priority Data

Feb. 27, 1991 [JP] Japan .................................. 3-53676

[51] Int. Cl.[5] .......................................... H01L 41/08

[52] U.S. Cl. .......................... 310/313 R; 310/313 D; 364/821

[58] Field of Search .............................. 364/819, 821; 310/313 R, 313 B; 333/150, 154

[56] References Cited

U.S. PATENT DOCUMENTS

| | | | |
|---|---|---|---|
| 3,970,778 | 7/1976 | Adkins | 310/313 R X |
| 4,625,184 | 11/1986 | Niitsuma et al. | 310/313 R X |
| 4,683,394 | 7/1987 | Koshino | 310/313 R |
| 4,683,395 | 7/1987 | Mitsutsuka | 310/313 R |
| 4,745,378 | 5/1988 | Niitsuma et al. | 310/313 B X |
| 4,757,226 | 7/1988 | Mitsutsuka et al. | 310/313 R |
| 4,798,988 | 1/1989 | Mitsutsuka | 310/313 R |
| 4,993,000 | 2/1991 | Niitsuma et al. | 310/313 R X |
| 5,028,101 | 7/1991 | Sugai et al. | 310/313 R X |
| 5,030,930 | 7/1991 | Sugai | 310/313 R X |
| 5,059,848 | 10/1991 | Mariani | 310/313 R |

FOREIGN PATENT DOCUMENTS

| | | |
|---|---|---|
| 61-296807 | 12/1986 | Japan . |
| 62-1421 | 1/1987 | Japan . |
| 62-64113 | 3/1987 | Japan . |
| 63-62281 | 3/1988 | Japan . |
| 63-197111 | 8/1988 | Japan . |

*Primary Examiner*—Mark O. Budd

*Attorney, Agent, or Firm*—Flynn, Thiel, Boutell & Tanis

[57] ABSTRACT

In an SAW convolver device constructed by sealing an SAW convolver element having a piezoelectric film/insulator/semiconductor structure by means of a cover of a package, according to the present invention, an insulating base plate is disposed on a part of a metallic base plate of the package, on which insulating base plate there is disposed a resistor or a coil, and the gate electrode of the convolver is grounded in a DC-like manner through the resistor or coil.

Owing to the construction described above, it is possible to prevent that a voltage due to electrostatic charge, an accidental voltage due to erroneous handling, etc. are applied to the gate electrode of a zero bias type SAW convolver. As the result, it is possible to stabilize characteristics of the zero bias type SAW convolver for a long period of time and to improve the reliability thereof.

11 Claims, 6 Drawing Sheets

SURFACE ACOUSTIC WAVE CONVOLVER DEVICE

FIELD OF THE INVENTION

The present invention relates to a surface acoustic wave convolver (hereinbelow called SAW convolver) device capable of working, even if the bias voltage applied to the gate electrode thereof is zero volt (hereinbelow called zero bias type convolver) among SAW convolvers having a piezoelectric film/insulator/semiconductor structure.

BACKGROUND OF THE INVENTION

FIGS. 10, 11 and 12 show the construction of prior art zero bias type convolvers having a piezoelectric film/insulator/semiconductor structure.

FIG. 10 is a perspective view of a zero bias type convolver, FIG. 11 is a cross-sectional view thereof, and FIG. 12 is a cross-sectional view of a zero bias type convolver having another construction. In these figures, reference numeral 1 is a piezoelectric film; 2 is an insulator; 3 is a semiconductor; 4 is a p or n conductivity type semiconductor layer; 5 is an n or p conductivity type semiconductor layer; 6 is a semiconductor epitaxial layer; 7 is a gate electrode; 8 is a rear electrode; 9 is interdigital electrodes of an input transducer; 10 is a high impurity concentration n or p conductivity type semiconductor substrate; 11 is an input terminal; and 12 is an output terminal.

FIGS. 11 and 12 represent different constructions for the semiconductor 3. In the construction indicated in FIG. 11, the semiconductor 3 has a three-layered structure of p conductivity type semiconductor/n conductivity type semiconductor/high impurity concentration n conductivity type semiconductor substrate or n conductivity type semiconductor/p conductivity type semiconductor/high impurity concentration p conductivity type semiconductor substrate. The two semiconductor layers (4 and 5) formed on the high impurity concentration n or p conductivity type semiconductor substrate 10 are semiconductor epitaxial layers 6 formed on the semiconductor substrate 10 by depletion and in many cases the semiconductor uppermost layer 4 is formed by the ion implantation method. The construction indicated in FIG. 11 represents a typical zero bias type convolver. This is because it is possible to set the gate voltage (working voltage), for which the convolution efficiency Ft of the convolver is highest, in the neighborhood of zero volt, by the fact that only the semiconductor uppermost layer 4 has a conductivity type, which is opposite to that of the other semiconductor layers (5 and 10). Concerning the detail on the construction indicated in FIG. 11, refer to following literatures [1] and [2].

Literature [1]

Syuichi MITSUTSUKA, etc. "Trial fabrication of a zero bias drive type monolithic $ZnO/SiO_2/Si$ convolver" Preliminary Report of Autumn Meeting 1986 of Applied Physical Society of Japan, P. 905

Literature [2]

JP-A-Sho 62-64113 (laid open Mar. 23, 1987)

On the other hand, in the construction indicated in FIG. 12, the semiconductor 3 has a two-layered structure of semiconductor epitaxial layer/high impurity concentration semiconductor substrate. The high impurity concentration semiconductor substrate is the n or p conductivity type semiconductor substrate 10. The gate voltage (working point) when the convolution efficiency Ft is highest is at a value other than zero volt in an ideal state, where there exists no fixed electric charge in the insulator 2 and further the interfacial level density at the interface of insulator/semiconductor is negligibly low. Therefore, in an ideal element having the construction indicated in FIG. 12, when the gate voltage (voltage between the gate electrode 7 and the rear electrode 8) is at zero volt, the convolution efficiency Ft is low. However, in a real element, the gate voltage when the convolution efficiency Ft is highest can be in the neighborhood of zero volt, because fixed electric charge enters the insulator 2 or interfacial levels are formed in the process for forming the piezoelectric film 1 (for which the sputtering method, the CVD method, etc. are used). In such a case, zero bias drive is made possible even with the construction indicated in FIG. 12. Concerning the detail on the construction indicated in FIG. 12, refer to following literatures [3] and [4].

Literature [3]

JP-A-Sho 63-62281 (laid open Mar. 18, 1988)

Literature [4]

JP-A-Sho 63-197111 (laid open Aug. 16, 1988)

The SAW convolver indicated in FIG. 10, as explained above, is sealed in a package at practical use, similarly to a usual SAW filter, taking resistance to environment and handling into account.

FIG. 13 shows an example of the prior art package construction for the SAW convolver. In the figure, 13 is an SAW convolver; 14 is a shielding electrode; 15 is a sound absorber; 16 is a cover of the package; 17 is a base plate of the package; 18 is an input signal pin; 19 is an output signal pin; and 20 is a ground pin.

In the SAW convolver 13 in FIG. 13, shielding electrodes 14 and sound absorbers 15 omitted in FIG. 10 are indicated. Each of the shielding electrodes 14 is located between each set of interdigital electrodes 9 and the gate electrode 7 and grounded within the package, as indicated in FIG. 13 (connected with the base plate of the package through a bonding wire). The shielding electrodes 14 are disposed for preventing that a part of the input signal inputted to the interdigital electrodes 9 leaks directly to the gate electrode 7 through electromagnetic coupling so that a part of the input signal is superposed on the convolution output signal. Since these shielding electrodes are well known for the SAW convolver element, they are no specifically shown in the construction indicated in FIG. 10. Further the sound absorbers 15 are disposed for preventing unnecessary reflected wave of the surface acoustic wave from the end surfaces of the SAW element. Since these are also well known for the SAW element, these are not shown in the construction indicated in FIG. 10.

In the prior art are package indicated in FIG. 13, the base plate 17 of the package is made of metal and the SAW convolver 13 is mounted on the base plate 17 described above so that the rear electrode 8 of the convolver and the base plate 17 are connected electrically and in addition secured mechanically to each other (die bonding process). Usually the die bonding process is effected often by using conductive adhesive. Consequently the base plate 17 of the package serves as a ground plane for the convolver. At this time, the input signal pins 18 and the output signal pins 19 are insulated electrically from the base plate 17 and the output signal pins are connected with a plurality of points on the gate electrode 7 of the convolver. Further, on the package there is disposed a ground pin 20 connected electrically with the base plate 17 apart from the input signal pins described above. The cover 16 of the package is usually made of metal similarly to the base plate. The cover 16 and the base plate are welded usually by the electric resistance welding method, filling the package with inert gas such as $N_2$ gas, so that the package is hermetically sealed.

If the package construction indicated in FIG. 13 is utilized for the package of the zero bias type SAW convolver as indicated in FIG. 10, following problems are produced.

In the SAW convolver having a piezoelectric film/insulator/semiconductor structure, when a bias voltage is applied directly between the gate electrode 7 and the rear electrode 8, injection or emission of electric charge in or from the piezoelectric film 1 is produced. When such injection or emission of electric charge is produced, the working point (gate voltage, for which the convolution efficiency Ft is highest) of the convolver is generally shifted. Consequently, in the zero bias type SAW convolver, even in the case where the working point is originally in the neighborhood of zero volt, when a DC bias voltage is applied thereto as described previously, injection or emission of electric charge in or from the piezoelectric film is produced so that the working point is shifted to a voltage other than those in the neighborhood of zero volt. In such a case, even if the gate voltage is set at zero volt in the zero bias type SAW convolver, the convolution efficiency Ft decreases remarkably with respect to the original value thereof. Such decrease of the convolution efficiency Ft continues, until the injected or emitted electric charge is again emitted or injected so that the thermal equilibrium state before the application of the DC bias voltage is reestablished. However, at a temperature below the room temperature, since the resistivity of the piezoelectric film 1 is generally great, a period of time longer than at least several hours is required often, before electric charge, which has been once injected or emitted, returns so that the electric charge distribution in the original thermal equilibrium state is reestablished.

When the characteristics of the zero bias type SAW convolver indicated in FIG. 10 as described above is considered, in the prior art package construction indicated in FIG. 13, since the output pins 19 are insulated electrically from the base plate 17 of the package acting as the ground plane, there is a risk that a voltage due to electrostatic charge or an accidental voltage due to erroneous handling of the package is applied thereto. Since such a voltage is applied thereto, as described previously, even for the SAW convolver, with which a high convolution efficiency Ft can be obtained originally at zero volt, only a low convolution efficiency Ft can be obtained in a long period of time. That is, in the case where the prior art package construction indicated in FIG. 13 is used for the zero bias type convolver, it has a problem in the stability for a long period of time or the reliability of the characteristics of the SAW convolver.

OBJECT OF THE INVENTION

The object of the present invention is to provide a surface acoustic wave convolver device capable of improving the stability for a long period of time and the reliability of the characteristics thereof, which is a zero bias type SAW convolver having a piezoelectric film/insulator/semiconductor structure.

SUMMARY OF THE INVENTION

In order to achieve the above object, a surface acoustic wave convolver device according to the present invention comprises an SAW convolver element having a piezoelectric film/insulator/semiconductor structure and provided with input transducers and an output gate electrode formed in contact with the piezoelectric film; a package sealing the SAW convolver element; and grounding means for grounding the gate electrode in a DC-like manner within the package.

In a surface acoustic wave convolver device having the construction described above, since the gate electrode of the SAW convolver is grounded in a DC-like manner within the package, it is possible to prevent that a voltage due to electrostatic charge or an accidental voltage is applied to the gate electrode.

DETAILED DESCRIPTION

Figure 1:
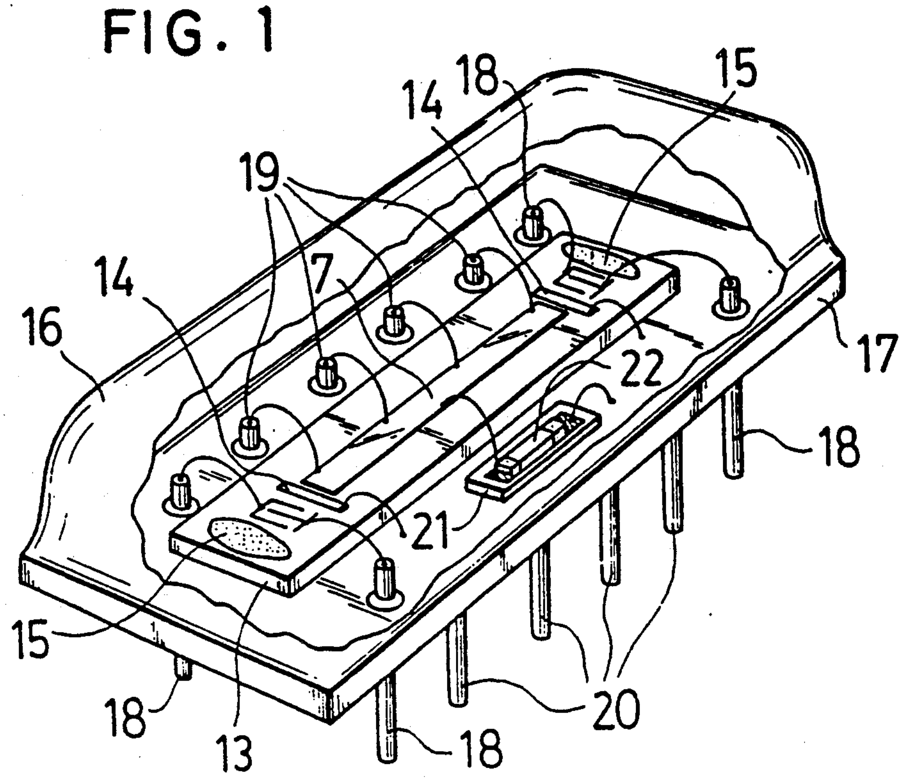
FIG. 1 is a perspective view of a surface acoustic wave convolver showing an embodiment of the present invention.
Figure 2:
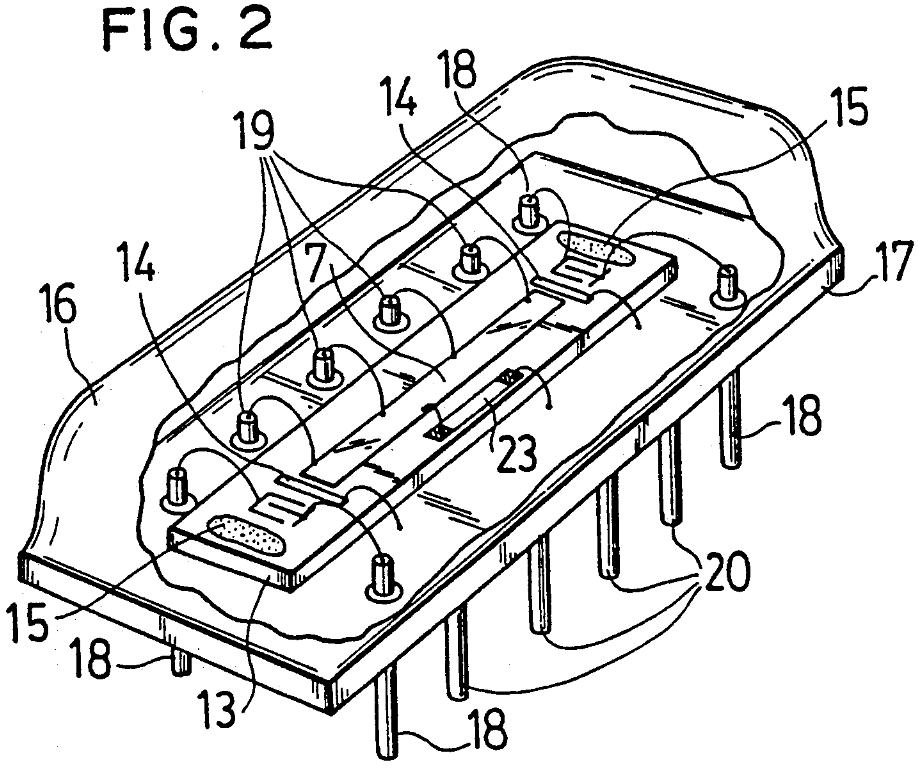
FIG. 2 is a perspective view of a surface acoustic wave convolver showing another embodiment of the present invention.

FIG. 1 shows an embodiment of the present invention and FIG. 2 shows similarly another embodiment of the present invention. FIGS. 3 to 4, FIGS. 5 to 7 and FIGS. 8 to 9 represent examples of the construction of the SAW convolver suitable for realizing the second embodiment indicted in FIG. 2.

Both the embodiments indicated in FIGS. 1 and 2 are characterized in that the gate electrode 7 of the zero bias type SAW convolver is grounded in a DC-like manner within the package of the convolver. However it is persisted that it is grounded in the meaning of a DC-like manner and it is grounded through an element, which has a satisfactorily high impedance in the frequency band of the output signal of the convolver so that it gives no influences on an output matching circuit at taking-out the output signal to the exterior.

In FIG. 1, in order to realize what is described above, an insulating base plate 21 apart from an SAW convolver element 13 is disposed within the same package and a resistor or a coil 22 is disposed or formed on the insulating base plate 21. The gate electrode 7 of the convolver is grounded through the resistor or coil 22 (connected with the base plate 17 of the package). Further the resistor or coil described above may be a separate part such as a chip resistor or a chip inductance, a thick or thin film resistor formed on the insulating base plate 21, or a coil formed by winding helicoidally a conductor similarly on the insulating base plate.

On the contrary, in FIG. 2, a resistor portion 23 is formed in a part of the SAW convolver element 13 and the gate electrode 7 of the convolver is grounded through the resistor portion 23 stated above (connected with the base plate 17 of the package).

As described above, in FIG. 1, the gate electrode 7 is grounded through the resistor or coil within the package, while in FIG. 2 the gate electrode 7 is grounded through the resistor disposed within the convolver element. Here, denoting the resistance in the case where it is grounded through the resistor by R, the inductance in the case where it is grounded by the coil by L, and the capacitance of the gate of the convolver (capacitance between the gate electrode 7 and the rear electrode 8) by C, it is supposed that R and L satisfy following conditions;

$$R >> 1/(2\pi f \cdot C) + Rb \quad (1)$$

$$L >> 1/\{(2\pi f)^2 \cdot C\} + Rb/2\pi f \quad (2)$$

where f represents an arbitrary frequency within the frequency band of the output signal of the convolver. That is, denoting the lower limit and the upper limit of the frequency band of the output signal by $f\lambda$ and fh, respectively, it is supposed that $$f\lambda \leqq f \leqq fh \quad (3)$$

Further Rb represents the resistance of the semiconductor under the gate.

The conditions represented by Equations (1) to (3) are conditions, which should be satisfied in order that R or L is an impedance sufficiently greater than the gate portion of the convolver.

If the conditions described above are not satisfied, when the convolver is viewed from the output matching circuit side, the impedance of the convolver is determined almost by the impedance of the gate portion and the impedance of R or L can be neglected (because R or L is connected with the impedance of the gate portion in parallel). Therefore, if the conditions represented by Equations (1) to (3) are not satisfied, R or L gives almost no influences on the output matching circuit in the frequency band of the output signal and as the result it gives almost no influences also on the convolution efficiency Ft. This is the reason why the value of R or L should satisfy the conditions represented by Equations (1) to (3). An example of concrete numerical values is as follows; approximately $R >> 2.71 \sim 2.91\Omega$ and $L \leqq \leqq 0.96 \sim 1.32$nH, in the case where C=500pF, Rb=2Ω, $f\lambda$=350MHz and fh=450MHz. The resistor or the coil satisfying the value of R or L described above can be amply realized within the package.

Figure 13:
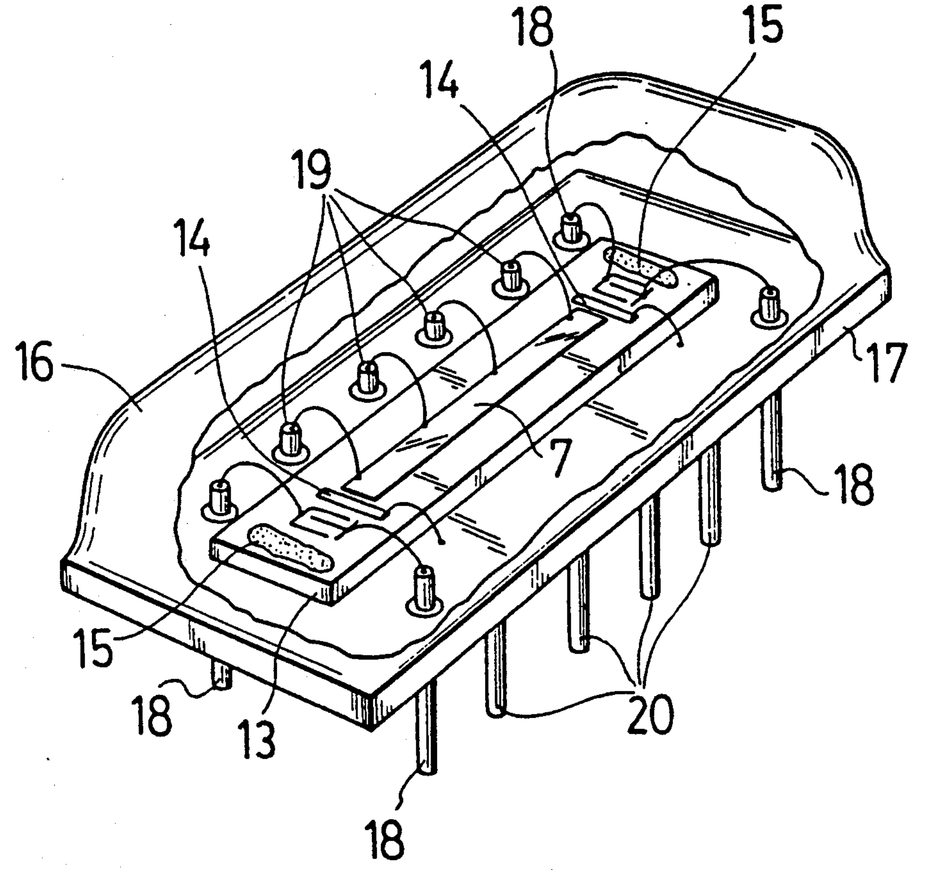
FIG. 13 PRIOR ART
FIG. 13 is a perspective view showing a packaging construction in a prior art SAW convolver.

Now the reason why the gate electrode 7 of the convolver is grounded in a DC-like manner through R or L within the package according to the present invention will be described. This is done for the purpose of solving the problem that in FIG. 13 there is a risk that a voltage due to electrostatic charge or an accidental voltage due to erroneous handling of the package is applied to the zero bias type SAW convolver, as described previously as a problem of the prior art technique, and as the result the original characteristics of the convolver are impaired for a long period of time.

The drawback of the prior art technique as described above is due to the fact that the gate electrode 7 is connected only with the output signal pins 19, in a state where the output signal pins 19 of the prior art package (FIG. 13) are insulated electrically from the base plate 17 of the package, and as the result the gate electrode 7 is isolated in a DC-like manner from the ground plane (base plate 17). That is, in the prior art package indicated in FIG. 13, the gate electrode 7 is always in an electrically opened state and it is subjected directly to a voltage due to electrostatic charge or an accidental voltage due to erroneous handling of the package, which causes variations in the characteristics of the zero bias type SAW convolver.

On the contrary, in FIGS. 1 and 2, the gate electrode 7 is grounded (connected with the base plate 17) in a DC-like manner through the resistor R or the coil L within the package. For this reason, owing to the construction indicated in the figures, it is possible to prevent that a voltage due to the electrostatic charge or an accidental voltage is applied to the gate electrode 7. As the result, it is possible to stabilize the characteristics of the zero bias type SAW convolver for a long period of time and to improve the reliability with respect to that obtained by the prior art technique.

Influences of the electrostatic charge can be almost completely eliminated by grounding the gate electrode through the resistor. However, in the case where a voltage is applied forcedly thereto by erroneous handling, it is impossible to avoid that a voltage of a certain degree is applied to the gate electrode 7. With this respect, it is more advantageous to ground the gate electrode through the coil, because almost no voltage is applied to the gate electrode 7 (owing to the fact that the DC resistance of a coil is extremely small), even if erroneous voltage application as described above is produced. However, even in the case where the resistor R is used, the recovery time of the characteristics of the convolver after the erroneous voltage application is significantly shorter than that obtained in the state where the gate electrode 7 is opened as in the conventional case indicated in FIG. 13. With this respect, even if the gate electrode is grounded through the resistor R, a significantly greater effect can be obtained in the stabilization of the characteristics of the convolver than by the prior art technique.

Next FIGS. 3 and 4, FIGS. 5 to 7, and FIGS. 8 and 9 will be explained. These figures show concrete constructions of the resistor portion 23 disposed within the SAW convolver indicated in FIG. 2.

Figure 3:
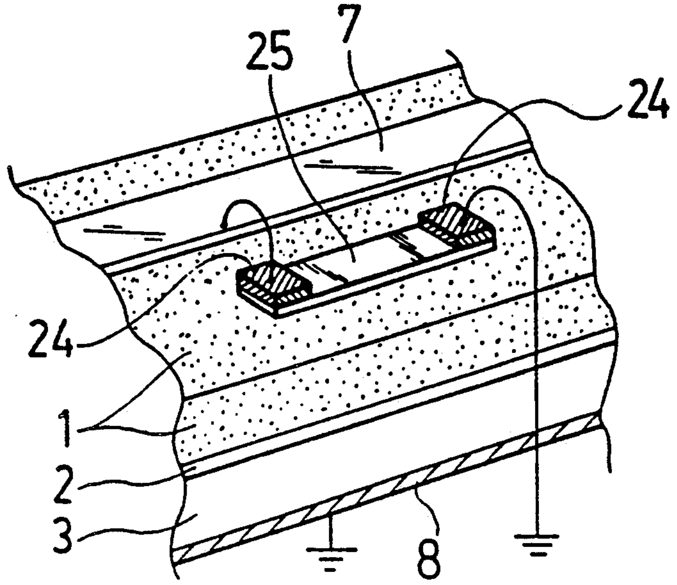
FIG. 3 is a perspective view of a construction, in which a resistor portion is formed on a piezoelectric film.
Figure 4:
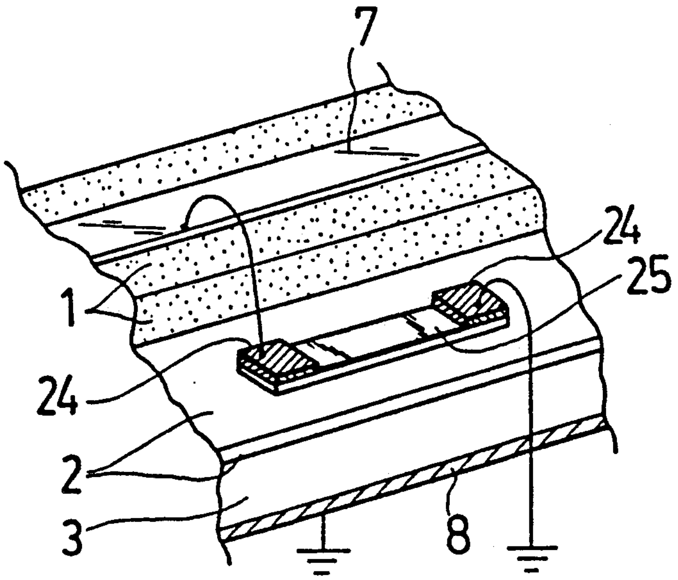
FIG. 4 is a perspective view of a construction, in which a resistor portion is formed on an insulator.

In FIGS. 3 and 4, the resistor portion 23 described above is realized by forming a thin film resistor on the convolver. FIG. 3 shows a construction, in which a thin film resistor 25 is formed on the piezoelectric film 1, while FIG. 4 shows a construction, in which the thin film resistor 25 is formed on the insulator 25. Metallic electrodes 24 are disposed on the two ends of the thin film resistor 25. One of the metallic electrodes 24 is connected with the gate electrode 7 and the other of the metallic electrodes 24 is connected with the ground plane (base plate of the package) through respective bonding wires. Thin films made of semiconductors such as amorphous Si, etc. or alloys or metal such as Ni-Cr, Cr-Si, Ta, etc. may be used for the thin film resistor.

Figure 5:
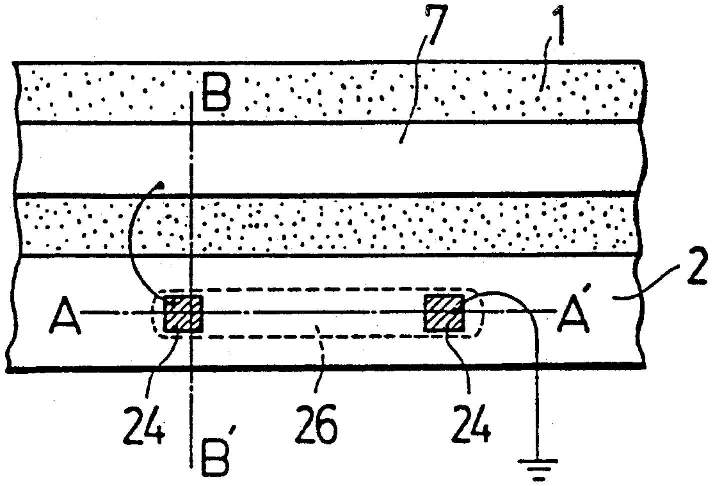
FIG. 5 is a top view of a construction of the resistor portion according to another embodiment.
Figure 6:
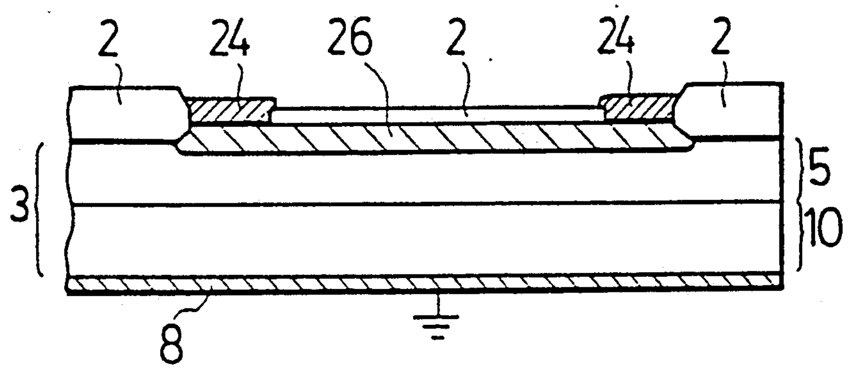
FIG. 6 is a cross-sectional view along a line A—A' in FIG. 5.
Figure 7:
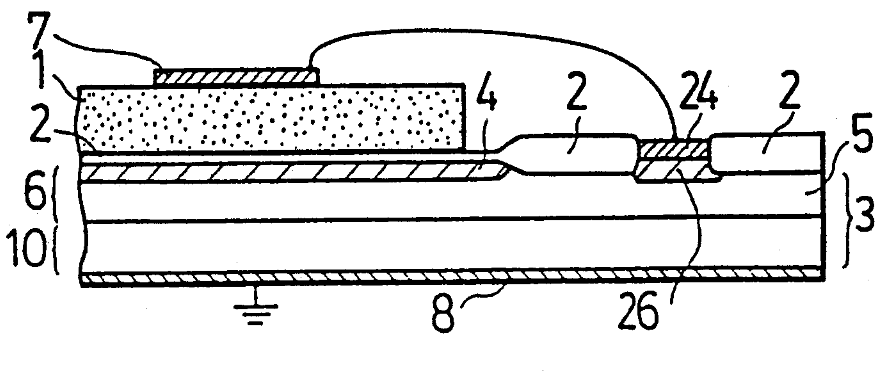
FIG. 7 is a cross-sectional view along a line B—B' in FIG. 5.

FIGS. 5 to 7 show examples, in which the resistor portion indicated in FIG. 2 is formed in a part of the semiconductor of the SAW convolver. Although the SAW convolvers indicated in FIGS. 5 to 7 represent examples using the construction indicated in FIG. 11, a similar resistor portion can be disposed also in the construction indicated in FIG. 12.

Figure 12:
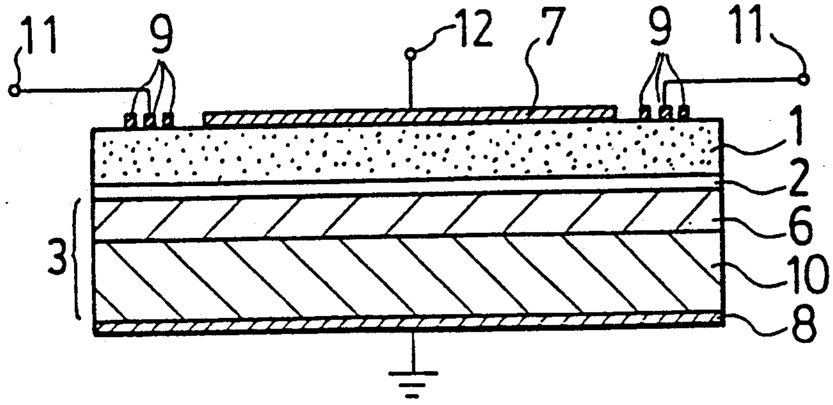
FIG.12 PRIOR ART
FIG. 12 is a cross-sectional view of another prior art SAW convolver.

In FIGS. 5 to 7, a resistor portion 26 made of p or n conductivity type semiconductor is formed in the semiconductor just below the insulator 2 and the metallic electrodes 24 are disposed at the two ends thereof. One of the metallic electrodes 24 is connected with the gate electrode 7 and the other of the metallic electrodes 24 is connected with the ground plane (base plate) through respective bonding wires. Here the resistor portion 26 is made of p conductivity type semiconductor, when the semiconductor 3 has a three-layered structure of p conductivity/type semiconductor/n conductivity type semiconductor/high impurity concentration semiconductor substrate, and n conductivity type semiconductor, when the semiconductor 3 has a three-layered structure of n conductivity type semiconductor/p conductivity type semiconductor/high impurity concentration semiconductor substrate. However, in the case of the three-layered structure as described above, as indicated in FIGS. 5 to 7, the uppermost layer 4 of the semiconductor under the gate electrode 7 of the convolver and the resistor portion 26 are isolated spatially from each other so as not to be conductive electrically therebetween. On the contrary, in the case where an SAW convolver having the construction indicated in FIG. 12 is used for the convolver, the resistor portion 26 is made of semiconductor having a conductivity type opposite to that of the semiconductor epitaxial layer 6. It is for forming a natural depletion layer between the resistor portion 26 and the surrounding semiconductor that the conductivity type of the semiconductor, of which the resistor portion 26 is made, is so determined. When such a depletion layer is formed, since no low resistance conduction is produced between the metallic electrode 24 and the rear electrode 8, current flows through the resistor portion 26 and therefore the resistor portion 26 can act as a desired resistor. Although, in FIGS. 5 to 7, the thickness of the insulator 2 varies, depending on the position, the thickness of the insulator may be uniform, if the upper layer 4 of the semiconductor under the gate electrode in FIGS. 5 to 7 and the resistor portion 26 are sufficiently distant from each other and they cannot be conductive therebetween.

Figure 8:
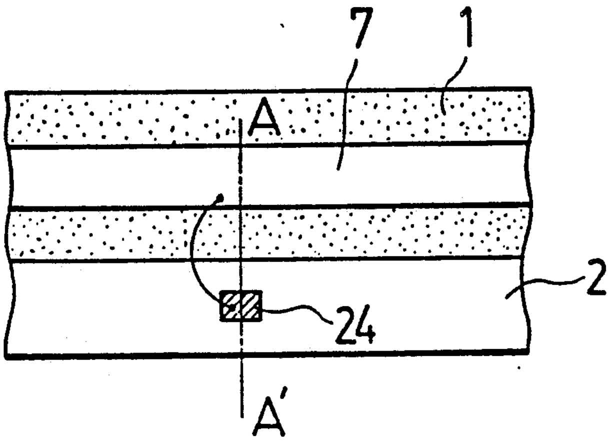
FIG. 8 is a top view of a construction of the resistor portion according to still another embodiment.
Figure 9:
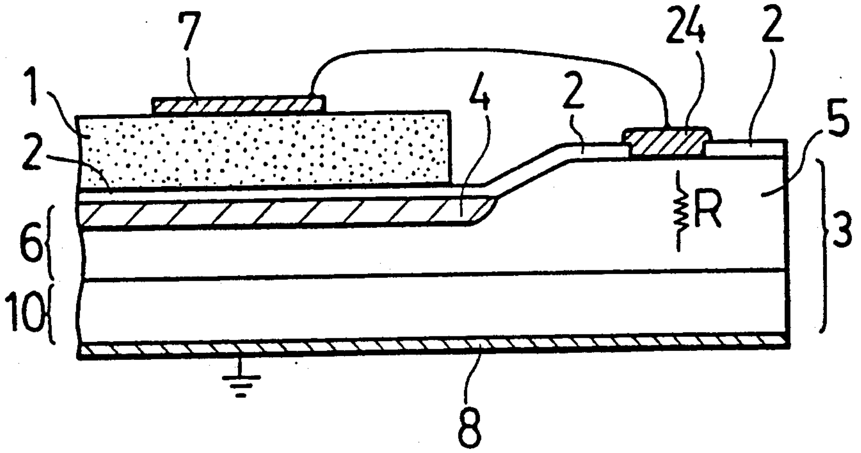
FIG. 9 is a cross-sectional view along a line A—A' in FIG. 8.
Figure 10:
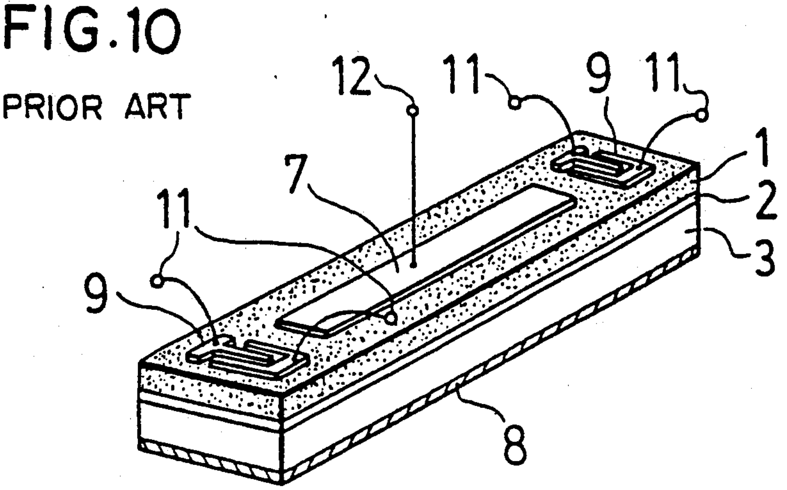
FIG.10 PRIOR ART
FIG. 10 is a perspective view of a prior art SAW convolver.
Figure 11:
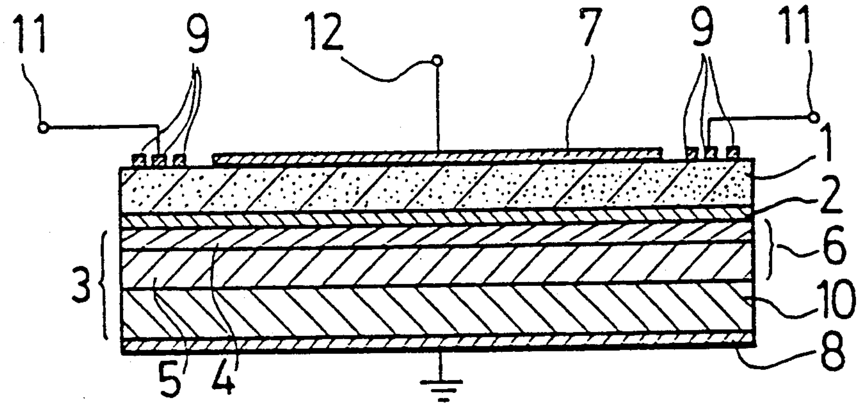
FIG.11 PRIOR ART
FIG. 11 is a cross-sectional view of the SAW convolver stated above.

Now FIGS. 8 and 9 will be explained. FIGS. 8 and 9 represent also examples, in which the resistor portion 23 in FIG. 2 is formed in a part of the semiconductor layer of the convolver. Contrarily to the fact that the resistor portion is formed in the longitudinal direction of the semiconductor in FIGS. 5 to 7, the devices indicated in FIGS. 8 and 9 are characterized in that the resistor portion is formed in the depth direction of the semiconductor. FIGS. 8 and 9 represent examples, in which the construction indicated in FIG. 11 is used for the SAW convolver, and the devices indicated therein is so constructed that the piezoelectric film 1 and the uppermost layer 4 of the semiconductor are formed only in the neighborhood of the gate electrode 7, which is important for the operation of the convolver, and the piezoelectric film 1 and the uppermost layer 4 of the semiconductor don't exist at the part, where the resistor portion is formed. In the case where the construction indicated in FIG. 12 is used for the SAW convolver, the devices indicated in FIGS. 8 and 9 are so constructed that there is no uppermost layer 4 of the semiconductor. In FIGS. 8 and 9, the insulator 2 is removed at the part, where the resistor portion is formed, the metallic electrodes 24 are disposed, and one of the metallic electrodes 24 is connected with the gate electrode 24 through a bonding wire. At this time, an ohmic junction is formed between the metallic electrode 24 and the semiconductor layer 5 (between the metallic electrode 24 and the semiconductor epitaxial layer 6, in the case where the construction indicated in FIG. 12 is used). In this case, as indicated in FIGS. 8 and 9, the depth direction between the metallic electrode 24 and the rear electrode 8 corresponds to the resistance R. This construction has an advantage that since one end of the resistance R acts as the rear electrode 8, it is grounded automatically and therefore wire bonding should be effected only once between the gate electrode 7 and the metallic electrode 24. Although, in FIGS. 8 and 9, the part of the semiconductor layer 5 (semiconductor epitaxial layer 6, in the case where the construction indicated in FIG. 12 is used), where the resistor portion is formed, is thicker than the other part, in the case where the resistivity of the semiconductor layer is sufficiently high, it is not necessary that the semiconductor layer is partially thick and the thickness of the whole semiconductor layer 3 may be uniform.

Materials for the monolithic SAW convolver having the piezoelectric film/insulator/semiconductor structure used for realizing the present invention are not specifically restricted. ZnO, AλN, etc. can be used for the piezoelectric film; $SiO_2$, SiNx, etc. for the insulator; and Si, GaAs, etc. for the semiconductor. A ZnO/$SiO_2$/Si structure is known as a construction having a specifically high convolution efficiency Ft. In the case where the present invention is realized, it is specifically advantageous to use a zero bias type SAW convolver having such a construction made of such materials.

According to the present invention, package means can be obtained, which can improve further the stability for a long period of time and the reliability of the characteristics of an SAW convolver with respect to the characteristics of the zero bias type SAW convolver having the piezoelectric film/insulator/semiconductor structure sealed by using prior art package means Further, according to the present invention, since the gate electrode is grounded in a DC-like manner already within the package, no grounding element (resistor or coil) for the gate electrode, which is necessary for zero bias drive, is required in a peripheral circuit at applying the SAW convolver. Therefore it is advantageous also from a point of view to contribute to the downsizing of the peripheral circuit.

Furthermore the SAW convolver, to which the present invention is applied, can be used in all sorts of devices using SAW convolvers. Concretely speaking, it can be applied to a spread spectrum communication device, a correlator, a radar, image processing, a Fourier transformer, etc.

What is claimed is:

1. A surface acoustic wave convolver device of zero bias type, comprising:

a SAW convolver element having a piezoelectric film/insulator/semiconductor structure and provided with input transducers and a zero bias output gate electrode formed in contact with said piezoelectric film and free of a DC voltage bias with respect to a circuit ground;

a package within which said SAW convolver element is sealed; and grounding means for coupling said gate electrode to said circuit ground within said package, said grounding means having an impedance and being capable of conducting DC current between said gate electrode and said circuit ground.

2. A surface acoustic wave convolver device according to claim 1, wherein said grounding means includes a circuit element which is one of a resistor and a coil.

3. A surface acoustic wave convolver device according to claim 2, wherein one end of said circuit element is connected with said output gate electrode and the other end thereof is connected to said circuit ground.

4. A surface acoustic wave convolver device according to claim 3, wherein said package includes a base plate on which said SAW convolver element is mounted, and a cover which covers said SAW convolver element, said other end of said circuit element being connected with said base plate.

5. A surface acoustic wave convolver device according to claim 1, including within said package an insulating base plate having thereon a circuit element which is one of a resistor and a coil and which is spaced from said SAW convolver element, said grounding means including said circuit element.

6. A surface acoustic wave convolver device according to claim 1, wherein said grounding means includes a resistor portion formed in one body with said SAW convolver element and having respective ends connected to said gate electrode and to said circuit ground.

7. A surface acoustic wave convolver device according to claim 6, wherein said resistor portion is a thin film resistor formed on said piezoelectric film in said SAW convolver element.

8. A surface acoustic wave convolver device according to claim 6, wherein said resistor portion is a thin film resistor formed on said insulator in said SAW convolver element.

9. A surface acoustic wave convolver device according to claim 6, wherein said resistor portion is formed in a part of said semiconductor in said SAW convolver element.

10. A surface acoustic wave convolver device according to claim 9, wherein said resistor portion is formed in a direction parallel to a surface of said semiconductor.

11. A surface acoustic wave convolver device according to claim 9, wherein said resistor portion is formed in a direction perpendicular to a surface of said semiconductor.

* * * * *